United States Patent
Augustin et al.

(10) Patent No.: US 7,723,244 B2
(45) Date of Patent: May 25, 2010

(54) METHOD FOR INTERNAL ELECTRICAL INSULATION OF A SUBSTRATE FOR A POWER SEMICONDUCTOR MODULE

(75) Inventors: Karlheinz Augustin, Fürth (DE); Christian Göbl, Nürnberg (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 807 days.

(21) Appl. No.: 11/122,175

(22) Filed: May 4, 2005

(65) Prior Publication Data
US 2005/0250247 A1 Nov. 10, 2005

(30) Foreign Application Priority Data
May 4, 2004 (DE) .................. 10 2004 021 927

(51) Int. Cl.
*H01L 21/20* (2006.01)
*H01L 21/31* (2006.01)
(52) U.S. Cl. .................. 438/782; 438/496; 438/584; 438/758
(58) Field of Classification Search .................. 438/496, 438/584, 758, 782
See application file for complete search history.

(56) References Cited

U.S. PATENT DOCUMENTS

| | | | | |
|---|---|---|---|---|
| 5,116,663 A | * | 5/1992 | Fujimoto et al. | 428/209 |
| 5,646,071 A | * | 7/1997 | Lin et al. | 438/763 |
| 5,874,128 A | * | 2/1999 | Kim | 427/240 |
| 5,916,631 A | * | 6/1999 | Mahneke | 427/240 |
| 6,441,479 B1 | * | 8/2002 | Ahn et al. | 257/700 |
| 6,445,353 B1 | * | 9/2002 | Weinbrenner | 343/763 |
| 6,549,409 B1 | * | 4/2003 | Saxelby et al. | 361/704 |
| 6,730,542 B2 | * | 5/2004 | Wang et al. | 438/108 |
| 7,041,535 B2 | * | 5/2006 | Yamashita et al. | 438/122 |
| 7,074,726 B2 | * | 7/2006 | Sugimoto et al. | 438/745 |
| 7,141,454 B2 | * | 11/2006 | Matayabas et al. | 438/127 |

FOREIGN PATENT DOCUMENTS

EP  0 791 961  8/1997

OTHER PUBLICATIONS

André A. Jaecklin Future Devices and Modules for Power Electronic Applications pp. 1-8.
Lianhua Fan, C. P. Wong 2001 International Symposium on Advanced Packaging Materials pp. 230-235.
German Office Action dated Sep. 1, 2006 issued in corresponding foreign application No. 10 2004 021 927.3.

* cited by examiner

*Primary Examiner*—Matthew C Landau
*Assistant Examiner*—James M Mitchell
(74) *Attorney, Agent, or Firm*—Cohen Pontani Lieberman & Pavane LLP

(57) ABSTRACT

A method for internal electrical insulation of a substrate for a power semiconductor module having a framelike insulating housing with a cap and having an insulating substrate. The substrate has conductor tracks and power semiconductor components mounted thereon. The power semiconductor components are connected to connection elements, e.g., further conductor tracks or power semiconductor components, by means of bond connections. The method is characterized by the following steps: a) forming the substrate; b) coating the substrate with a viscous dielectric insulation compound in a casting process or immersion process; c) initiating the cross-linking of the insulation compound; d) with the substrate in a suspended position, permitting excess insulation compound to drip off, and securely enveloping the bond connections with insulation compound; and e) placing the substrate in the housing.

6 Claims, 2 Drawing Sheets

METHOD FOR INTERNAL ELECTRICAL INSULATION OF A SUBSTRATE FOR A POWER SEMICONDUCTOR MODULE

BACKGROUND OF THE INVENTION

1. Field of the Invention

The invention is directed to a method for the internal electrical insulation of a substrate for a power semiconductor module. Such power semiconductor modules comprise a plastic framelike insulating housing with a cap and an insulating substrate. At least one conductor track is mounted on the substrate and at least one power semiconductor component is mounted on the conductor track. The power semiconductor component is connected to connection elements, further conductor tracks, and/or further power semiconductor components as necessary in the circuit with which it is to be used. Bond connections are the state of the art for such connections that are internal to a module.

2. Description of the Related Art

The state of the art in internal insulation of such power semiconductor modules is potting the modules with a dielectric insulation compound, which comprises either so-called hard casting or so-called soft casting, or a combination of the two. Because of the chemical composition of the hard casting compound and its attendant health risks, hard casting is being used less and less. Variously embodied silicone rubbers have become established as the state of the art for soft casting.

Often, two-component silicone rubber variants are used that are not mixed in a suitable device until just before the power semiconductor module is filled. Filling power semiconductor modules and hence internally insulating them is done up to a fill level that assures that all the relevant components to be insulated are securely covered.

A disadvantage of the aforementioned internal insulation of power semiconductor modules in the prior art is that a high proportion of the potting compound used is not truly necessary for insulation but instead is disposed inside the power semiconductor module solely for the sake of creating a homogeneous filling.

SUMMARY OF THE INVENTION

The object of the instant invention is to present a method for internal electrical insulation of a substrate for a power semiconductor module, which, while the electrical properties remain the same, reduces the amount of insulation compound used by at least half.

The inventive method is based on a power semiconductor module for mounting directly on a heat sink, with the power semiconductor module having a plastic framelike insulating housing. This plastic housing also has a cap, preferably joined to the housing. One face of the cap is formed by a substrate, which comprises an insulation layer and at least one metal layer disposed on the insulation layer and oriented toward the interior of the power semiconductor module. This metal layer may intrinsically be structured and forms at least one conductor track of the power semiconductor module. At least one power semiconductor component is disposed on this conductor track and is connected to at least one connection element, leading to the outside, and to a further conductor track and/or a further power semiconductor element as is appropriate for the circuit with which it is to be used.

The first embodiment of the method of the invention includes the following steps:

Forming the substrate. At least one power semiconductor component is disposed on a conductor track, preferably by soldering. Next, appropriate connections are made among the power semiconductor component, the connection elements, further conductor tracks, and/or further power semiconductor components. Such connections are preferably made by wire or bond connections.

Coating the substrate with a viscous dielectric insulation compound. To that end, it is preferred to use casting processes, since in such processes the insulation compound securely fills even regions covered, for instance, with bond wires. The casting process can be pressure-reinforced, to speed it up.

Initiating the cross-linking of the insulation compound. Advantageously, in the method of the invention, insulation compounds whose cross-linking is initiated by the action of ultraviolet light or heat are used. At this point in the method, complete cross-linking of the insulating compound is to be avoided.

Rotating the substrate about its longitudinal axis (X axis). As a result, the excess insulation compound can drip off and securely envelop existing bond connections with insulation compound.

Placing the substrate in the housing of the power semiconductor module. When the insulation compound is not yet completely cross-linked, it advantageously also acts as an adhesive and causes an adhesive bond between the housing and the substrate.

The casting process is especially advantageous if it is pressure-reinforced, and/or if a spin-stream casting process of the prior art is employed, since then the insulation compound is distributed quickly and evenly over the substrate.

The second embodiment of the invention includes the following steps:

Forming the substrate as in the first embodiment.

Immersing the substrate, by the side having the at least one power semiconductor component, in the viscous dielectric insulation compound. In this fashion, the insulation compound penetrates into all the interstices, of the kind that may be present underneath the bond connections. While the substrate is removed and during an optional additional waiting period, excess insulation compound can drip off, and in the process the insulation compound also envelops the components, particularly the bond connections that are present.

Initiating the cross-linking of the insulation compound as in the first embodiment. Compared to the previous method step, the orientation of the substrate, with the assembled side facing down, is maintained. It is thus assured that sufficient enveloping of the bond connections is attained. In this method step, analogously to the first embodiment, it is preferable for the cross-linking not yet to be complete.

Causing excess insulation compound to drip off and securely enveloping the bond connections that are present with insulation compound, as in the first embodiment.

Placing the substrate in the housing of the power semiconductor module as in the first embodiment.

It is advantageous in both embodiments of the inventive method that all the parts of the power semiconductor module that are to be insulated, and especially the bond connections, are adequately wetted with the dielectric insulation compound and enveloped therein.

It is also advantageous in both embodiments of the method of the invention if the substrate is intermittently set into rotation about its vertical axis (Z axis) during the dripping-off process, to speed up that process.

It is equally advantageous if, during the dripping-off method step, the substrate is subjected to a vacuum, since, as a result, any gas inclusions that may be present in the insulation compound are effectively removed.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings like referenced numerals refer to like elements.

DETAILED DESCRIPTION OF THE PRESENTLY PREFERRED EMBODIMENTS

Figure 1:
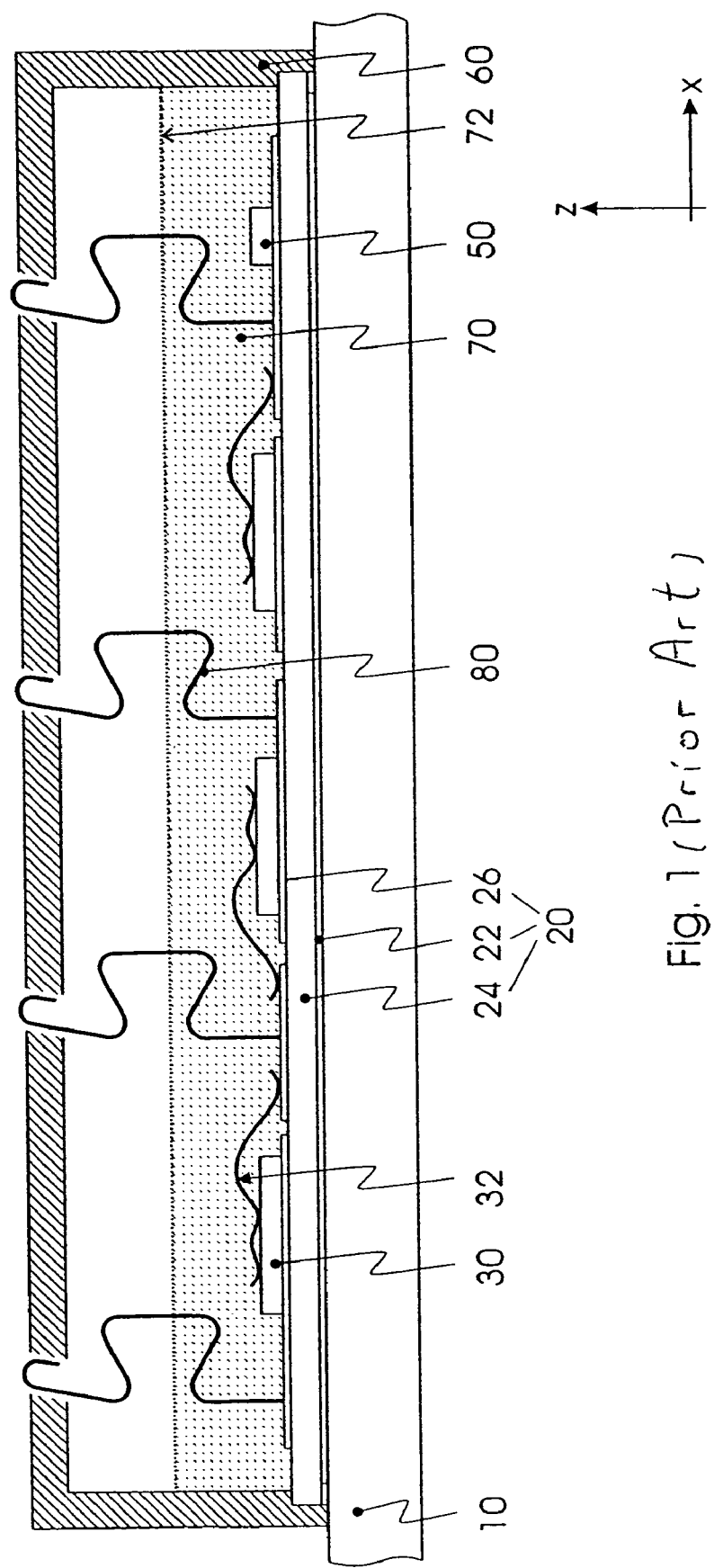
FIG. 1 shows a section through a power semiconductor module of the prior art.

Shown in FIG. 1 are a heat sink 10, a substrate 20 of the power semiconductor module disposed on it, and a housing 60 framing and covering the substrate according to the prior art. The substrate 20 comprises an insulation body 24, preferably of an industrial ceramic such as aluminum oxide or aluminum nitrite, and metal layers 22, 26 on both sides of insulation body 24. Metal layers 22, 26 are applied to insulation body 24 by the known process of direct cupper bonding ("DCB"). Metal layer 26 is oriented toward an interior of the housing 60, and is preferably intrinsically structured and thus forms conductor tracks that are insulated from one another. These conductor tracks 26 carry power semiconductor components 30, such as diodes, thyristors, IGBTs and/or MOSFETS and sensor components 50, which are disposed on the conductor tracks by soldered connections. Further circuit-appropriate connections of the power semiconductor components 30 to further conductor tracks 26 are made by means of wire bond connections 32.

Conductor tracks 26 of substrate 20 are connected to external supply leads by contact springs 80.

The internal insulation of the power semiconductor module is formed by a silicone rubber 70, which fills the interior of the power semiconductor module to approximately half its height. The surface 72 of the silicone rubber that faces away from the substrate 20 therefore forms a substantially smooth face.

Figure 2:
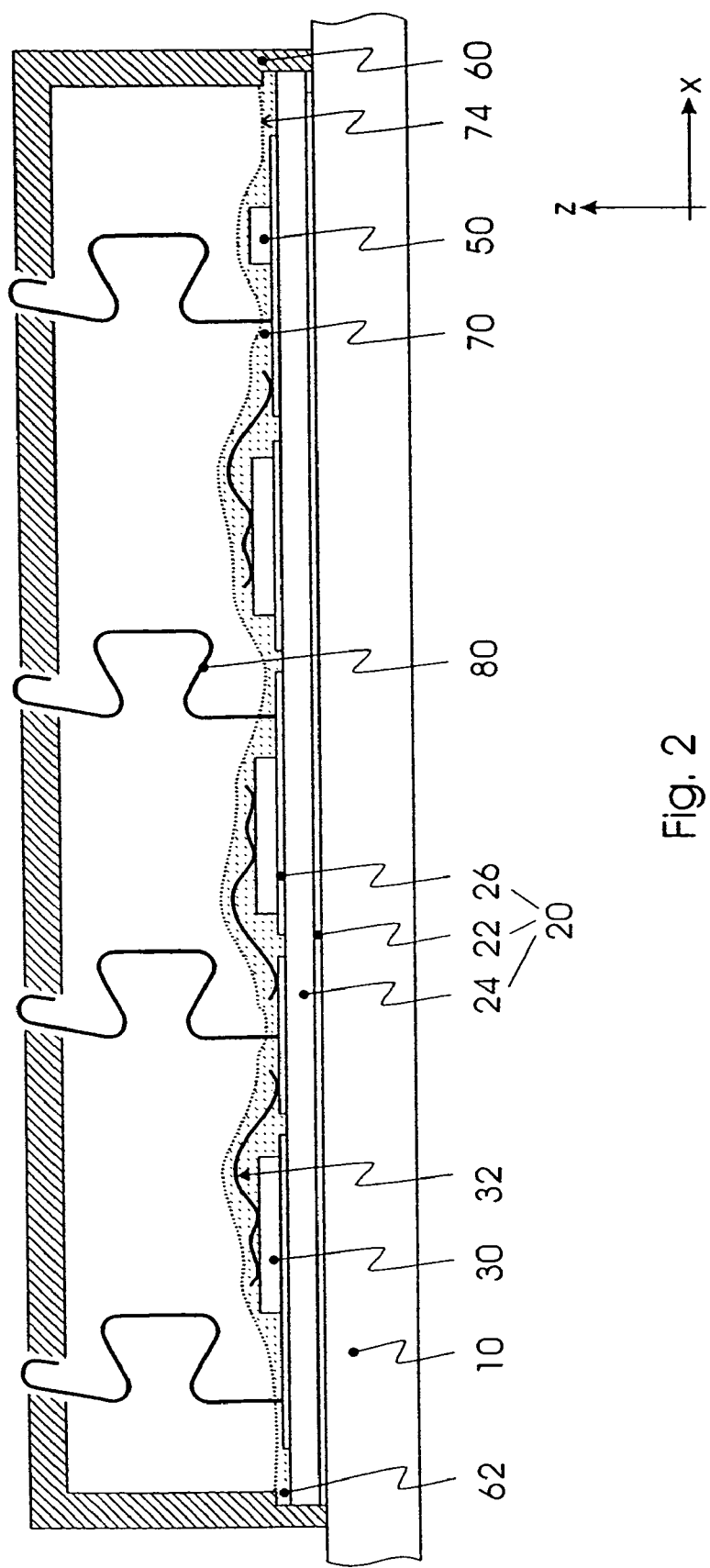
FIG. 2 shows a section through a power semiconductor module having internal insulation embodied according to the invention.

FIG. 2 shows a power semiconductor module having internal insulation embodied according to the invention. Heat sink 10 and the substrate 20, along with power semiconductor components 30 and their circuit-appropriate connections, are all shown as in FIG. 1.

As illustrated in FIG. 2, insulation compound 70 has been applied to the substrate 20 in accordance with one of the two embodiments of the method of the invention. Insulation compound 70 was applied up to the edge of substrate 20 and had not yet become completely cross-linked by the time the substrate 20 was placed on housing 60. Housing 60 here is designed such that in this arrangement relative to one another, a recess 62 remains over part of the width of housing 60. The Insulation compound 70 disposed in this recess 62 acts here, after its complete hardening, as an adhesive bond connecting housing 60 and substrate 20.

Insulation compound 70 applied by the method of the invention has one surface 74, which generally follows the contour of substrate 20, with power semiconductor components 30 disposed on it and with bond connections 32. Because of the method of the invention and a viscosity, adapted to it, of the insulation compound 70 of between 400 and 1400 mPa·s, all the surfaces of the substrate 20, all power semiconductor components 30, and above all, all bond connections 32 are covered sufficiently well to insulate them electrically.

Moreover, insulation compound 70 has the following parameters: a specific conductance of more than $10^{15}$ ohms, and a dielectric constant of between 2.5 and 3.

It is apparent that by means of the method of the invention for forming an internal insulation of the substrate of a power semiconductor module, the amount of insulation compound 70 used can be reduced by more than half, without changing the electrical properties of the final structure.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for internal electrical insulation of a substrate for a power semiconductor module having a framelike insulating housing with a cap and having an insulating substrate with at least one conductor track and at least one power semiconductor component mounted thereon, and at least one connection for connecting said power semiconductor component to at least one of connection elements, further conductor tracks and power semiconductor components, the method comprising the following steps:

forming said substrate with said at least one power semiconductor component and said at least one connection, said substrate having a longitudinal axis;

coating said substrate with a viscous dielectric insulation compound in a casting process;

initiating the cross-linking of said insulation compound;

rotating said substrate about said longitudinal axis so that said insulation compound securely envelops said at least one connection thereby permitting excess insulation compound to drip off, wherein during the dripping off of said insulation compound, said substrate is intermittently rotated about a vertical axis thereof, so as to speed up the dripping-off process; and placing said substrate in said housing.

2. The method of claim 1, wherein said step of initiating said cross-linking is performed by exposing said substrate to ultra-violet light.

3. The method of claim 1, wherein said step of initiating said cross-linking is performed by heating said insulation compound.

4. The method of claim 1, wherein said insulation compound has a specific conductance of more than approximately $10^{15}$ ohms, a viscosity of between approximately 400 and approximately 1400 mPa·s and a dielectric constant of between approximately 2.5 and approximately 3.

5. The method of claim 1, wherein said step of coating said substrate with said dielectric insulation compound is performed in a pressure-reinforced spin-stream casting process.

6. The method of claim 1, further comprising exposing said substrate to a vacuum while permitting said excess insulation compound to drip off.

* * * * *